(12) United States Patent
Kurosawa

(10) Patent No.: US 8,106,672 B2
(45) Date of Patent: Jan. 31, 2012

(54) SUBSTRATE INSPECTION APPARATUS

(75) Inventor: Kiyoharu Kurosawa, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/868,522

(22) Filed: Aug. 25, 2010

(65) Prior Publication Data

US 2011/0050264 A1 Mar. 3, 2011

(30) Foreign Application Priority Data

Aug. 31, 2009 (JP) ................. 2009-201038

(51) Int. Cl.
- *G01R 31/20* (2006.01)
- *G01R 1/067* (2006.01)
- *G01R 31/26* (2006.01)

(52) U.S. Cl. .......... 324/754.01; 324/755.01; 324/762.01

(58) Field of Classification Search .......... 324/754.01–754.19, 762.01–762.09, 324/755.01–755.11, 72.5; 257/48; 438/14–18; 439/482, 82, 885

See application file for complete search history.

(56) References Cited

U.S. PATENT DOCUMENTS

| | | | | |
|---|---|---|---|---|
| 5,084,473 | A * | 1/1992 | Mikami et al. | 514/390 |
| 6,992,496 | B2 * | 1/2006 | Winter et al. | 324/750.25 |
| 7,309,996 | B2 * | 12/2007 | Tashiro et al. | 324/754.13 |
| 7,470,149 | B2 | 12/2008 | Kazama et al. | |
| 7,518,388 | B2 | 4/2009 | Tashiro et al. | |
| 7,748,989 | B2 | 7/2010 | Kazama et al. | |
| 2002/0093355 | A1 * | 7/2002 | Parker et al. | 324/761 |
| 2004/0239357 | A1 | 12/2004 | Tashiro et al. | |
| 2007/0111560 | A1 | 5/2007 | Kazama et al. | |
| 2008/0136433 | A1 | 6/2008 | Tashiro et al. | |
| 2009/0093161 | A1 | 4/2009 | Kazama et al. | |

FOREIGN PATENT DOCUMENTS

| | | |
|---|---|---|
| JP | UM 3-104863 | 10/1991 |
| JP | 06-94750 | 4/1994 |
| JP | 11-242067 | 9/1999 |
| JP | 2005-019343 | 1/2005 |
| JP | 2005-019384 | 1/2005 |
| JP | 2005-156530 | 6/2005 |
| JP | 2006-10668 | 1/2006 |
| JP | 2010-038837 | 2/2010 |

* cited by examiner

*Primary Examiner* — Huy Q Phan
*Assistant Examiner* — Tung X Nguyen
(74) *Attorney, Agent, or Firm* — Blakely, Sokoloff, Taylor & Zafman LLP

(57) ABSTRACT

According to one embodiment, a substrate inspection apparatus includes a probe socket, a probe pin, and an adaptor. The probe socket is fixed to an inspection jig on which a substrate is provided, one end of the probe socket being connected to a processor. The probe pin is attached to the other end portion of the probe socket, includes a tip shape conforming to an inspection point of the substrate with which the probe pin is in contact, and including at least one of a projection and a groove designed to specify the tip shape on a side on which the probe pin is attached to the probe socket. The adaptor is attached to the other end portion of the probe socket, and including a through hole formed in conformity with the shape of the side on which the probe pin is attached to the probe socket.

3 Claims, 3 Drawing Sheets

SUBSTRATE INSPECTION APPARATUS

CROSS-REFERENCE TO RELATED APPLICATIONS

This application is based upon and claims the benefit of priority from Japanese Patent Application No. 2009-201038, filed Aug. 31, 2009; the entire contents of which are incorporated herein by reference.

FIELD

Embodiments described herein relate generally to a substrate inspection apparatus that performs a predetermined measurement by making a probe pin in contact with an inspection point of a conducting portion, for example, of a substrate.

BACKGROUND

Mount substrates formed by mounting electronic components, such as ICs, on a printed circuit is subjected to an in-circuit test, a function test, and the like after mounting. The in-circuit test is a test performed to examine whether the electronic components, such as a resistance, an inductance, and a capacitance has required properties. The function test is a test performed to examine whether an electronic circuit formed on a mount substrate has required input/output properties.

The in-circuit test and the function test are performed using a probe socket fixed to an inspection jig, and a probe including a probe pin detachably attached to the probe socket. In this case, measurement is performed by making the probe pin in contact with an inspection point of a conductor, for example, of a mount substrate, and the measured result is processed by a measuring module connected to the probe socket.

When the probe pin of the probe is worn or deformed from repeated use, only the probe pin is withdrawn from the probe socket and is replaced with a new probe pin. While one type of probe socket in conformity with the diameter of the pin is usually used, various types of probe pins are used according to the weighting and the tip shape, and the like, and are selected according to the portion to be tested. When a large number of probe pins need to be replaced at a time for periodic maintenance, it is difficult to tell and confusing as to which type of pin should be attached to which portion of the socket. Confusion of the types of probe pins may cause problems, such as a connection failure, a disconnection with a nearby pad, and a contact with a nearby component.

Conventionally, a technique of forming a color belt in a probe pin so as to distinguish a probe pin for a semiconductor device inspection has been proposed (see Jpn. Pat. Appln. KOKAI Publication No. 2006-10668, for example).

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings, in general, according to one embodiment, a substrate inspection apparatus includes a probe socket, a probe pin, and an adaptor. The probe socket is fixed to an inspection jig on which a substrate as an inspection target is provided, including one end portion and other end portion, the one end portion being connected to a processor processing an inspection result of the substrate. The probe pin includes one end portion and other end portion, the one end portion detachably attached to the other end portion of the probe socket, the other end portion contacts an inspection point of the substrate and includes a tip shape conforming to the inspection point, and includes at least one of a projection and a groove designed to specify the tip shape on a side which is attached to the probe socket. The adaptor is attached to the other end portion of the probe socket, and which includes a through hole formed in conformity with the shape of the one end portion of the probe pin, such that the probe pin is attached to the probe socket.

Figure 1:
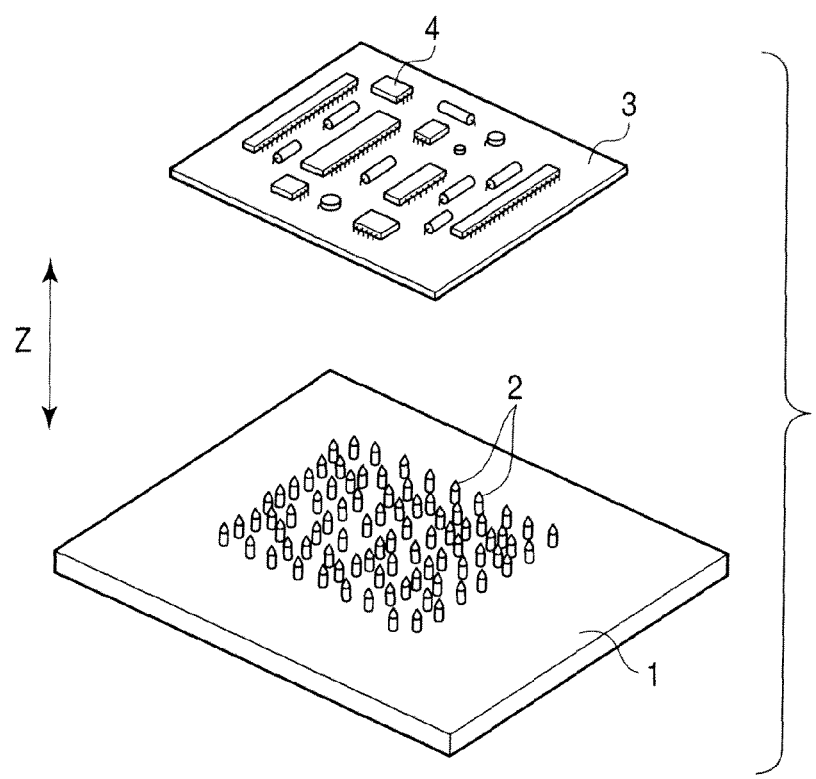
FIG. 1 is a perspective view illustrating an inspection state of a substrate inspection device, according to an embodiment.

FIG. 1 illustrates an inspection state of a substrate inspection apparatus according to an embodiment. In FIG. 1, the reference numeral 1 refers to an inspection jig, which includes a large number of (approximately 100-200) probes 2 in a plane, and is caused to move up and down in Z direction by an up-and-down mechanism, not shown, as shown in FIG. 1. A mount substrate 3 is mounted on the inspection jig 1. The number of probes 2 is equivalent to the number of positions corresponding to inspection points of the mount substrate 3.

The mount substrate 3 is formed by mounting an electronic component 4 on an upper surface using cream solder or a soldering pot.

At the time of inspection, a test land, which is an inspection point on a lower surface of the mount substrate 3, is made to contact a tip of the probe 2. In this contact state, an electronic voltage is applied and a current is supplied to the electronic component 4 via the probes 2 and various tests are performed. After the tests have ended, the mount substrate 3 is removed.

In order to favorably perform the above-described inspection, it is necessary to make the probes 2 always in contact with the inspection points at a predetermined pressure. This is because electric properties, such as impedance, differ according to the contact pressure.

Figure 2:
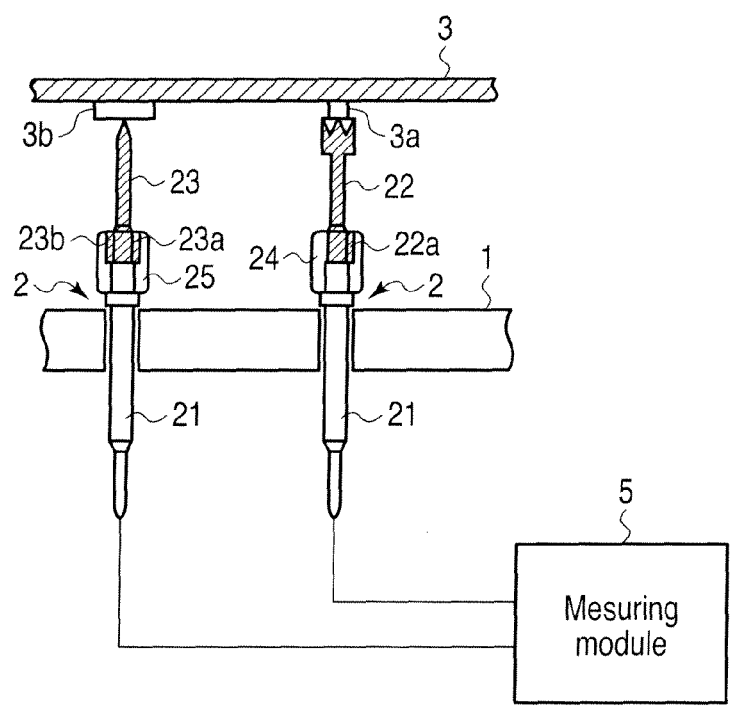
FIG. 2 is an exploded view of a probe shown in FIG. 1.

FIG. 2 is an exploded view extracting a portion of the substrate inspection apparatus.

A plurality of probe sockets 21 are provided in the inspection jig 1. Each of the probe sockets 21 is designed to detachably attached to the probe pins 22, 23, formed of a conducting material, at one end portion. The other end portion of each of the probe sockets 21 is connected to a measuring module 5 as a processor via a lead wire. The tip of the probe pin 22 has a crown shape, for example, and the probe pin 22 includes projecting portions 22a, 22b, configured to identify the crown shape on the side on which the probe pin 22 is attached to the probe socket 21. The projecting portion 22b is formed in a position crossing the projecting portion 22a. The tip end of the probe pin 22 is made to contact a test land 3a formed on the lower surface of the mount substrate 3.

The probe pin 23 has a convex tip, for example, and includes projecting portions 23a, 23b, configured to identify the convex shape on the side on which the probe pin 23 is inserted into the probe socket 21. The projecting portion 23b is formed in a position opposite to the projecting portion 23a. The tip of the probe pin 23 is made to contact a test land 3b formed on the lower surface of the mount substrate 3 and having an area greater than the test land 3a.

When the probe pins 22, 23 are in contact with the test lands 3a, 3b, respectively, of the mount substrate 3, the probe 2 supplies a necessary signal to the measuring module 5 via a lead wire from the probe socket 21. Upon receipt of the signal, the measuring module 5 processes the test result of the electronic component 4.

Between the probe socket 21 and the probe pin 22, there is interposed an adaptor 24. Further, between the probe socket 21 and the probe pin 23, there is interposed an adaptor 25.

Next, the connection configuration of the probe 2 will be described. In the description that follows, the probe socket 21, the probe pin 22, and the adaptor 24 will be described as representatives.

Figure 3:
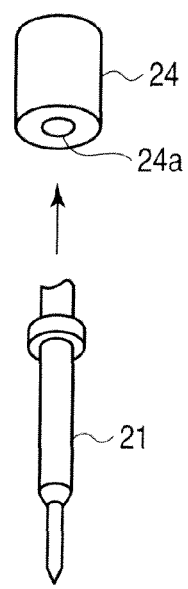
FIG. 3 is a perspective view illustrating a connection configuration of a probe socket and an adapter, according to the embodiment.
Figure 4:
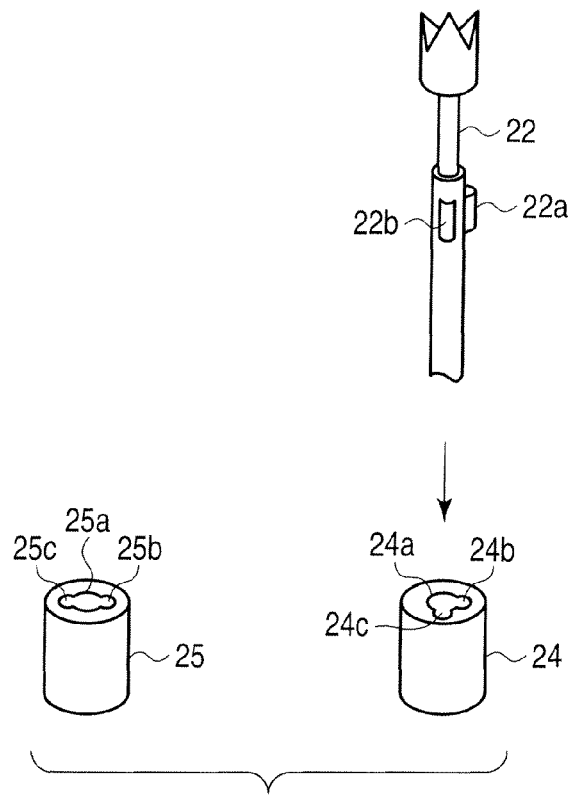
FIG. 4 is a perspective view illustrating a connection configuration of the probe pin and the adapter, according to the embodiment.

FIG. 3 is a perspective view illustrating a connection configuration of the probe socket 21 and the adaptor 24. FIG. 4 is a perspective view illustrating a connection configuration of the probe pin 22 and the adaptor 24.

The adaptor 24 includes a through hole 24a, such that one end portion of the probe socket 21 is inserted to an approximately central portion of the through hole 24a. Further, the adaptor 24 is formed such that concave portions 24b, 24c, into which the projecting portions 22a, 22b can be inserted, expand on the side of the through hole 24a on which the probe pin 22 is to be inserted. The adaptor 25 includes a through hole 25a, such that one end portion of the probe socket 21 is inserted into an approximately central portion of the adaptor 25. Further, the adaptor 25 is formed such that concave portions 25b, 25c, into which the projecting portions 23a, 23b can be inserted, expand on the side on which the probe pin 23 of the through hole 25a is to be inserted. Since the projecting portion 22b abuts against the plane surface of the adaptor 25 when the probe pin 22 is tried to be inserted into the adaptor 25, the probe pin 22 cannot be inserted into the adapter 25.

Figure 5A:
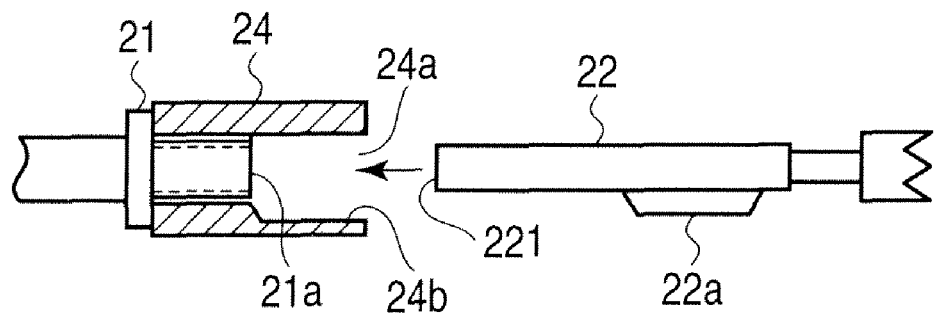
FIG. 5A is a cross-sectional side view of the probe pin before being inserted into the adapter, according to the embodiment.
Figure 5B:
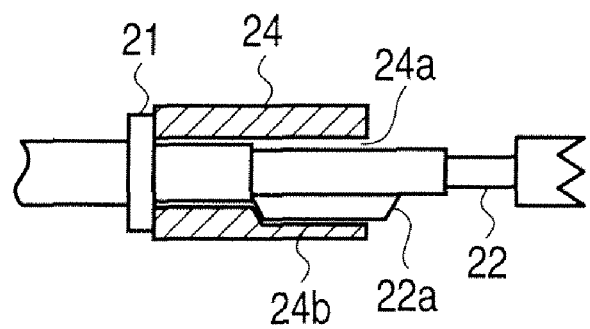
FIG. 5B is a cross-sectional side view of the probe pin after being inserted into the adapter.

FIG. 5A is a side view of the probe pin 24 before being inserted into the adaptor 24 while the probe socket 21 is inserted to the adaptor 24. FIG. 5B is a side view of the probe pin 22 inserted into the adaptor 24.

In the state shown in FIG. 5A, the probe socket 21 is inserted into the adaptor 24. When the probe pin 22 is inserted into the through hole 24a of the adaptor 24, a base portion 221 of the probe pin 22 is inserted into the hole portion 21a of the probe socket 21. When the base portion 221 of the probe pin 22 is inserted deeply into the hole portion 21a of the probe socket 21, the projecting portion 22a abuts against the concave portion 24b, as shown in FIG. 5B, and thereby the probe pin 22 is attached to the probe socket 21. In this case, the projecting portion 22b of the probe pin 22 abuts against the concave portion 24c of the adaptor 24.

Next, the operation of the above-described configuration will be described, by taking an example of the case where the probe pins 22, 23 are replaced.

At the time of inspection, the probe pins 22, 23 are attached to the probe sockets 21 such that they agree with the test lands 3a, 3b, respectively, of the mount substrate 3. Conventionally, replacement of the probe pin 22 with a new probe pin has been visually performed and often caused an error. In the present embodiment, on the other hand, a probe pin of a type different from the type of the probe pin 22 cannot be attached to the probe socket 21 only by interposing the adaptor 24 between the probe socket 21 and the probe pin 22. Accordingly, the inspection jig 1 and the probe socket 21 do not need to be modified at all.

Moreover, even if a new type of probe pin appears in the future, the only thing to do is to manufacture a compliant adaptor and replace the previous one with the new type.

As described above, according to the present embodiment, the adaptor 24, including the concave portions 24b, 24c, is interposed between the probe socket 21 and the probe pin 22, including a crown-shaped tip, such that the projecting portions 22a, 22b of the probe pin 22 can be inserted into the concave portions 24b, 24c. Further, the adaptor 24, including a concave portion, is interposed between the probe socket 21 and the probe pin 23 including a convex-shaped tip, such that the projecting portions 23a, 23b of the probe pin 23 can be inserted into the concave portions.

Thus, the adaptors 24, 25 make it impossible for the probe pins of types different from the compliant type to be attached to the probe socket 21. It is thereby possible to prevent problems, such as a contact failure, disconnection with a nearby pad, and a contact with a nearby component.

Further, according to the above-described embodiment, since concave portions 24b, 24c are formed such that the projecting portions 22a, 22b of the probe pin 22 can be inserted by forming the through hole 24a, into which the probe socket 21 is inserted, at the central portion of the adaptor 24, the adaptor 24 can be easily processed.

While the mount substrate 3 has been described in the above-described embodiment as an inspection target, there is no necessity to limit the inspection target to the mount substrate 3, as a matter of course. The inspection target may be the substrate itself, such as a printed wiring board before the electronic element is mounted.

Moreover, while the case has been described in the above-described embodiment where the projecting portions 22a, 22b, 23a, 23b specifying the tip shape are formed on the side on which the probe pins 22, 23 are attached to the probe sockets 21, a groove specifying the tip shape may be formed instead. In that case, the adaptors 24, 25 are formed to include a convex portion conforming to the groove of the probe pin to be inserted.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate inspection apparatus, comprising:
a probe socket fixed to an inspection jig on which a substrate as an inspection target is provided, the probe socket includes one end portion and other end portion, the one end portion being connected to a processor processing an inspection result of the substrate;

a probe pin which includes one end portion and other end portion, the one end portion of the probe pin detachably attached to the other end portion of the probe socket, the other end portion the probe pin contacts an inspection point of the substrate, the probe pin includes a tip shape conforming to the inspection point, and further includes at least one of a projection and a groove designed to specify the tip shape on a side which is attached to the probe socket; and an adaptor attached to the other end portion of the probe socket, the adaptor includes a through hole formed in conformity with the shape of the one end portion of the probe pin and the at least one of the projection and the groove designed to specify the tip shape, the probe pin is attached to the probe socket within the adaptor.

2. The substrate inspection apparatus of claim 1, wherein the adaptor includes a through hole into which the other end portion of the probe socket is inserted into a central portion of the through hole, and wherein an opening of the adaptor includes at least one of a concave and convex portion is formed in conformity with the shape of the one end portion of the probe pin on the side of the through hole on which the probe pin is inserted.

3. The substrate inspection apparatus of claim 2, wherein the probe pin includes a plurality of projections or grooves on the side on which the probe pin is attached to the probe socket, and wherein an opening of the adaptor includes a plurality of concave or convex portions formed in conformity with the shape of the one end portion of the probe pin, on the side of the through hole on which the probe pin is inserted.

* * * * *